(12) United States Patent
Daneman et al.

(10) Patent No.: US 6,330,102 B1
(45) Date of Patent: Dec. 11, 2001

(54) APPARATUS AND METHOD FOR 2-DIMENSIONAL STEERED-BEAM NXM OPTICAL SWITCH USING SINGLE-AXIS MIRROR ARRAYS AND RELAY OPTICS

(75) Inventors: Michael J. Daneman, Pacifica; Behrang Behin; Satinderpall Pannu, both of Berkeley, all of CA (US)

(73) Assignee: Onix Microsystems, Richmond, CA (US)

( * ) Notice: Subject to any disclaimer, the term of this patent is extended or adjusted under 35 U.S.C. 154(b) by 0 days.

(21) Appl. No.: 09/536,164

(22) Filed: Mar. 25, 2000

Related U.S. Application Data

(60) Provisional application No. 60/191,987, filed on Mar. 24, 2000, provisional application No. 60/191,856, filed on Mar. 24, 2000, and provisional application No. 60/192,097, filed on Mar. 24, 2000.

(51) Int. Cl.[7] ............................. G02B 26/00; G02B 27/10
(52) U.S. Cl. ............................................. 359/290; 359/627
(58) Field of Search .................................. 359/290, 291, 359/618, 627

(56) References Cited

U.S. PATENT DOCUMENTS

| | | | |
|---|---|---|---|
| 4,334,437 | * 6/1982 | Hunter et al. | 330/4.3 |
| 4,761,543 | * 8/1988 | Hayden | 235/457 |
| 6,042,240 | * 3/2000 | Strieber | 359/851 |

FOREIGN PATENT DOCUMENTS

| 19644918.9 | 4/1998 | (DE) | G02B/6/35 |
|---|---|---|---|

* cited by examiner

Primary Examiner—Ricky Mack
(74) Attorney, Agent, or Firm—J D I Patent; Joshua D. Isenberg

(57) ABSTRACT

A beam steering module and switching system. The steering module is composed of a N×M array of single axis mirrors able to rotate about a particular axis (X-axis), a second N×M array of single axis mirrors able to rotate about an axis orthogonal to that of the first N×M array of mirrors (Y-axis), and a relay lens designed to image the first mirror array onto the second mirror array such that the beam angle may be controlled in both the X and Y-axis by adjusting the angle of the appropriate mirrors in the X and Y mirror arrays. Two steering modules may be combined to form a switching system. With two such steering modules, it is possible to completely determine, at the plane of the output fiber array, the position and angle of an optical beam emerging from any of the input fibers.

23 Claims, 4 Drawing Sheets

APPARATUS AND METHOD FOR 2-DIMENSIONAL STEERED-BEAM NXM OPTICAL SWITCH USING SINGLE-AXIS MIRROR ARRAYS AND RELAY OPTICS

CROSS-REFERENCE TO RELATED APPLICATIONS

This application is a related to the following copending U.S. provisional applications, all of which are herein incorporated by reference: "Two-Dimensional Gimbaled Scanning Actuator with Vertical Electrostatic Comb-Drive for Actuation and/or Sensing" of Behrang Behin, Michael J. Daneman, Meng-Hsiang Kiang, Kam-Yin Lau, and Satinderpall Pannu, docket number 60/191,987; and "Self-Aligned Comb-Drive Actuators" of Behrang Behin and Satinderpall Pannu, docket number 60/191,856; and "Multi-Layer, Self-Aligned Vertical Comb-Drive Electrostatic Actuators and Fabrication Methods" of Behrang Behin and Satinderpall Pannu, docket number 60/192,097 all filed Mar. 24, 2000.

FIELD OF THE INVENTION

This invention relates generally to fiber optic communications. More particularly, the invention relates to optical switches for NxN arrays of fibers.

BACKGROUND ART

Modern fiber optical communications systems direct optical signals over multiple fibers. Such systems require optical switches to direct light beams from any given fiber in an input fiber array to any given fiber in an output array. One class of optical switches uses an approach called beam steering. In beam steering, the light from the fiber is selectively deflected or steered by one or more movable optical element from the input fiber to the output fiber. Suitable optical elements include microelectromechanical system (MEMS) mirrors. MEMS mirrors are usually actuated by magnetic interaction, electrostatic, or piezoelectric interaction. Typically, two sets of moveable mirrors are used to steer the beam. Each fiber has a small "acceptance window". The fiber only efficiently couples light that is incident within a narrow range of angles and positions. Although a single mirror will generally direct the beam from an input fiber to the correct output fiber, two mirrors ensure that the light beam enters the output fiber at the correct angle. If the beam makes too large an angle with the axis of the fiber, light from the beam will not couple properly to the fiber, i.e. there will be high losses.

Optical switches using the steering-beam approach have been demonstrated in two primary implementations. The first uses linear arrays of mirrors with a single angular degree of freedom. Combining two such mirror arrays as shown in FIG. 1 allows an implementation of an NxN optical switch, where the number of input and output channels is equal to the number of mirrors in each array. The first array steers an optical beam from an input fiber to the appropriate mirror on the second array, which then steers the beam into the corresponding output fiber. This implementation uses simple single-axis mirrors; however, it is limited in its scalability since the optical path between fibers becomes unreasonably large for large port counts (e.g. >32x32), increasing the loss of the switch.

The second implementation depicted in FIG. 2 uses two sets of 2-dimensional mirror arrays, each mirror having two angular degrees of freedom. The input and output fibers are each also arranged in a 2-dimensional grid with the same dimension as the mirror arrays. The mirrors in the first mirror array steer the optical beams from the fibers onto the appropriate mirror in the second mirror array which then steers the beam into the corresponding fiber. This approach is considerably more scalable, since, due to its 2-dimensional layout, the size of the mirror and fiber arrays grows as the square root of the number of input/output ports, which is much slower than in the case of a 1-dimensional grid. Therefore, switches with much larger port count (>2000x2000) are possible. However, this implementation requires the mirrors to rotate about two different axes. Such mirrors are considerably more difficult to design, fabricate, and control.

There is a need, therefore, for a beam steering apparatus that uses single axis optical elements to switch optical signals in an NxN fiber array.

OBJECTS AND ADVANTAGES

Accordingly, it is a primary object of the present invention to provide a beam steering system that uses single axis optical elements. It is a further object of the invention to provide a beam steering system wherein ability to switch a particular path is independent of the current configuration of the switch.

SUMMARY

These objects and advantages are attained by a beam steering module. The steering module generally comprises first and second NxM arrays of single axis mirrors. The mirrors in the first array rotate about a particular axis (X-axis) while the mirrors in the second array rotate about an axis different from the first axis (Y-axis). Relay optics disposed between the two arrays image the first mirror array onto the second mirror array such that the beam angle may be controlled with respect to both the X and Y-axes by adjusting the angle of the appropriate mirrors in the first and second mirror grids. The relay optics preserve at an image plane an angle of emergence with respect to an object plane. The relay optics typically comprise a confocal arrangement of lenses.

Two steering modules may be combined to form a beam steering system. With two modules, it is possible to completely determine, at the plane of the output fiber grid, the position and angle of an optical beam emerging from any of the input fibers.

Embodiments of the steering modules of the present invention may be used to selectively couple light from an input fiber in an NxN input fiber array to any output fiber in an NxN output fiber array.

DETAILED DESCRIPTION

Although the following detailed description contains many specifics for the purposes of illustration, anyone of ordinary skill in the art will appreciate that many variations and alterations to the following details are within the scope of the invention. Accordingly, the following preferred embodiment of the invention is set forth without any loss of generality to, and without imposing limitations upon, the claimed invention.

Figure 1:
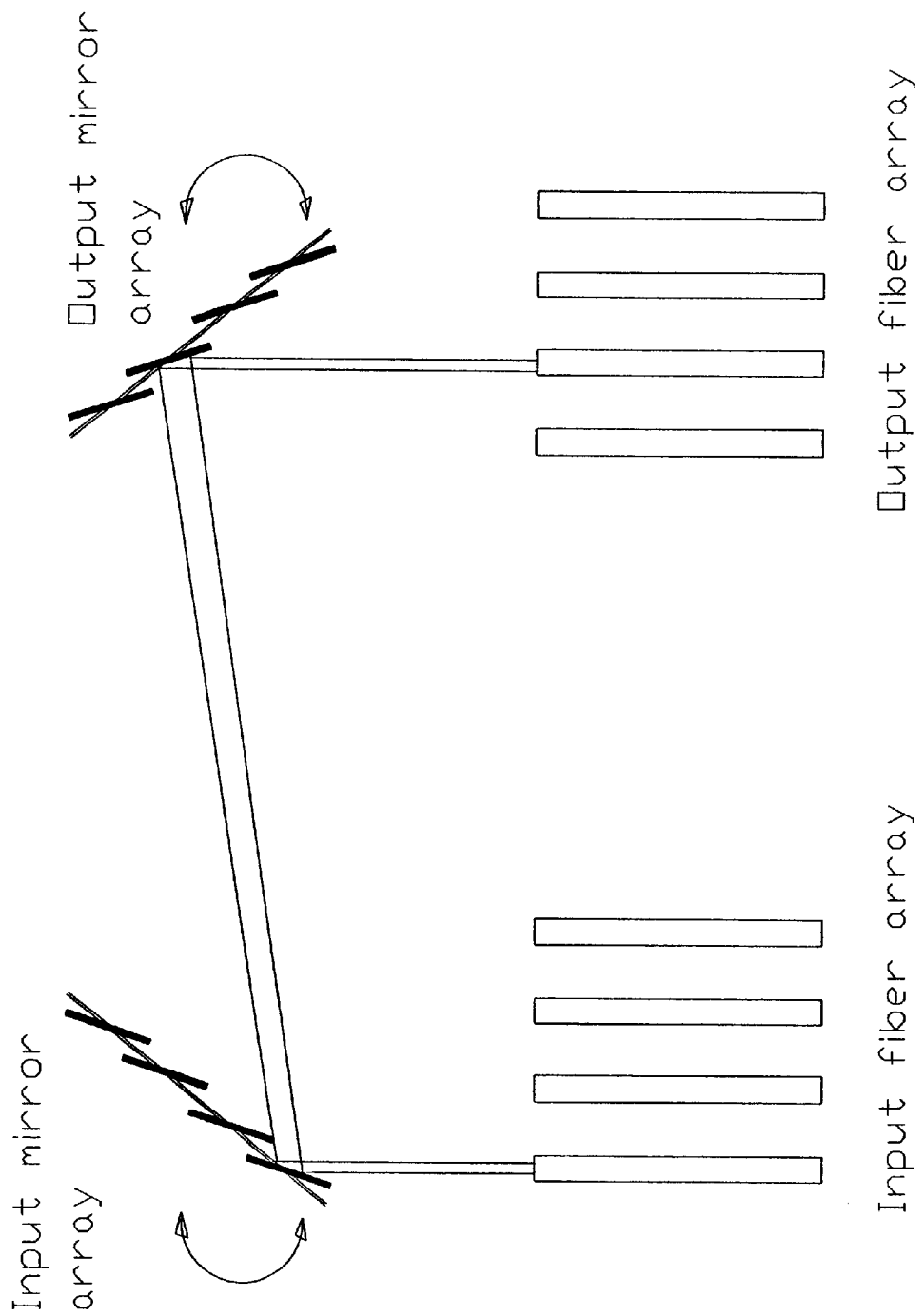
FIG. 1 depicts a one-dimensional beam steering apparatus according to the prior art.
Figure 2:
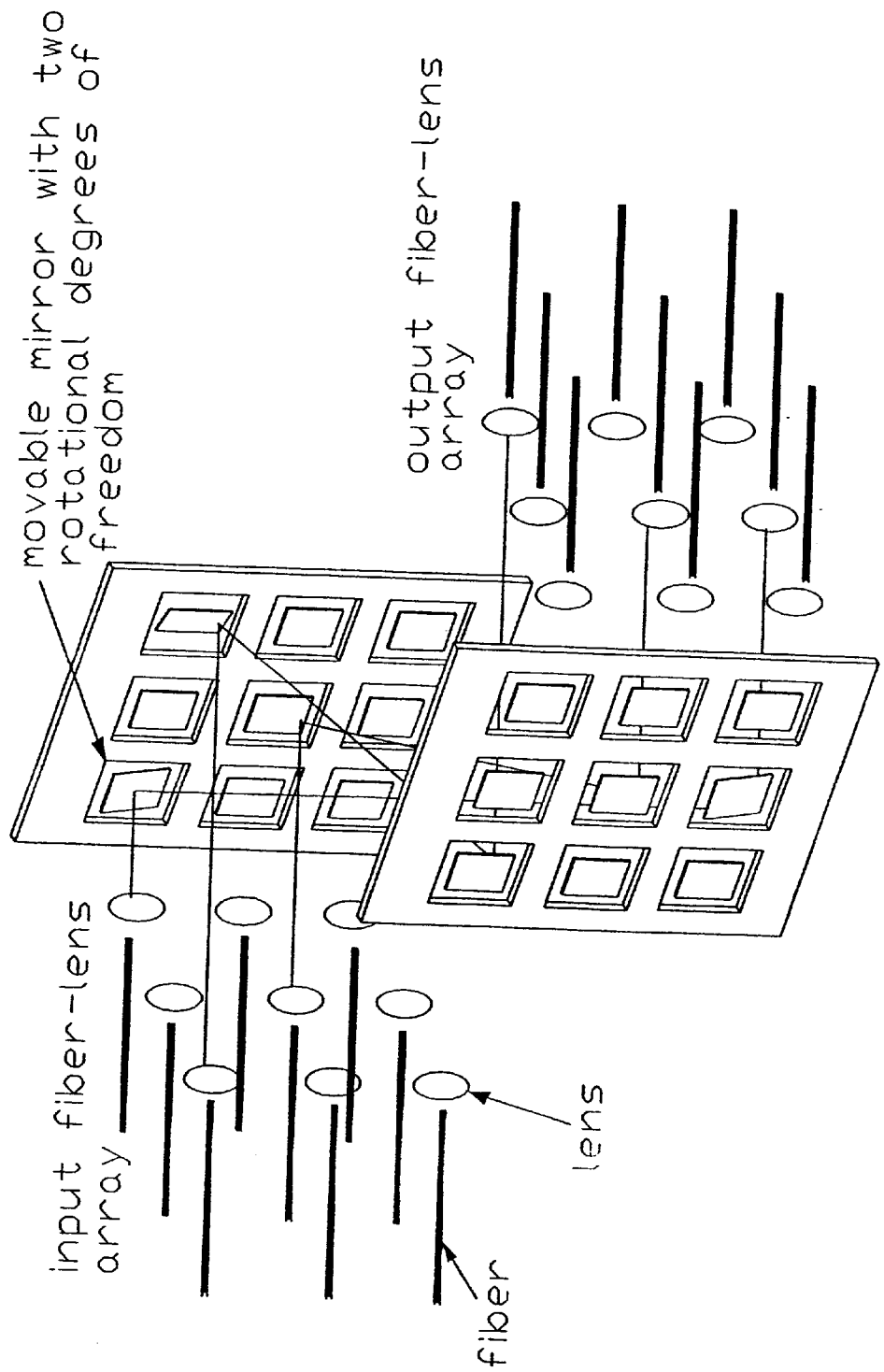
FIG. 2 depicts an isometric view of a two-dimensional beam steering apparatus according to the prior art.

The optical switch system according to embodiments of the present invention switches light from any of a set of input fibers into any of a set of output fibers in a non-blocking fashion (i.e. the ability to switch a particular path is independent of the current configuration of the switch). The switching system is generally built from steering modules. FIG. 2 depicts a steering module according to a first embodiment of the present invention. The steering module 100 generally comprises two 2-dimensional mirror arrays 110, 130 and relay optics 120 disposed along an optical path between the mirror arrays. The mirror arrays 110, 130 each typically comprise N×M arrays of single axis mirrors 112, 132. Generally N and M are integers greater than one. In the special case of square arrays, N=M.

In the present application, a single axis mirror refers to a moveable mirror configured to rotate about a single axis. Mirrors 112 and 132 rotate about axes 114, 134 that are different. Typically, mirrors 112 and mirrors 132 rotate about axes 114, 134 that are substantially orthogonal to each other. For example, mirrors 112 are configured to rotate about axes 114, oriented in a substantially horizontal plane. Mirrors 132 are configured to rotate about axis 134 oriented in a substantially vertical plane.

An input light beam 101 from a input fiber in a given row and column of an N×M input fiber array (not shown) impinges on a given mirror 112 in array 110. Mirrors 112 and 132 deflect the light beam 101 towards a fiber in an N×M output fiber array (not shown). Those skilled in the art will recognize that because the propagation of light is reversible, the role of input and output fibers may be reversed.

In an exemplary embodiment, relay optics 120 comprises a first focusing element 122 and a second focusing element 124 in a confocal configuration. For the purposes of this application the "focusing element" encompasses optical elements capable of focusing light. Such elements include refractive elements such as lenses, reflective elements such as mirrors, diffractive elements and micro-optical elements. Lenses include simple lenses and compound, i.e. multiple element lenses, graded refractive index (GRIN) lenses, ball lenses, and the like. Diffractive elements include Fresnel lenses and the like. In a confocal configuration, focusing elements 122 and 124 are characterized by the substantially same focal length f and separated from each other by a distance substantially equal to 2 f. Furthermore, array 110 is located a distance f from focusing element 122 and array 130 is located a distance substantially equal to f away from focusing element 124.

Relay optics 120 image mirror array 110 onto mirror array 130. The angle of beam 101 may be controlled with respect to both axes 114 and 134 by adjusting the angle of the appropriate mirrors in the arrays 110 and 130. For example, beam 101 emerges from mirror array 110 at an angle $\phi$ with respect to the object plane of relay optics 120. The object plane of relay optics 120 is typically located proximate mirror array 110. The image plane of relay optics 120 is typically located proximate mirror array 130. Relay optics 120 are configured to ensure that beam 101 impinges on the image plane of relay optics 120 at the same angle $\phi$. In other words, light beam 101 enters and leaves relay optics 120 at the same angle. Furthermore, parallel light entering relay optics 120 leaves as parallel light.

Steering module 100 may be used for beam steering in small port-count switches or if loss is not critical. Alternatively, module 100 may be used to switch beam 101 from input fibers in an N×M array to a grid or array of photodetectors. Mirrors in array 110 deflect light beam 101 to the row containing the desired output fiber or detector. Mirrors in array 130 deflect beam 101 to the desired column on that row.

Figure 3:
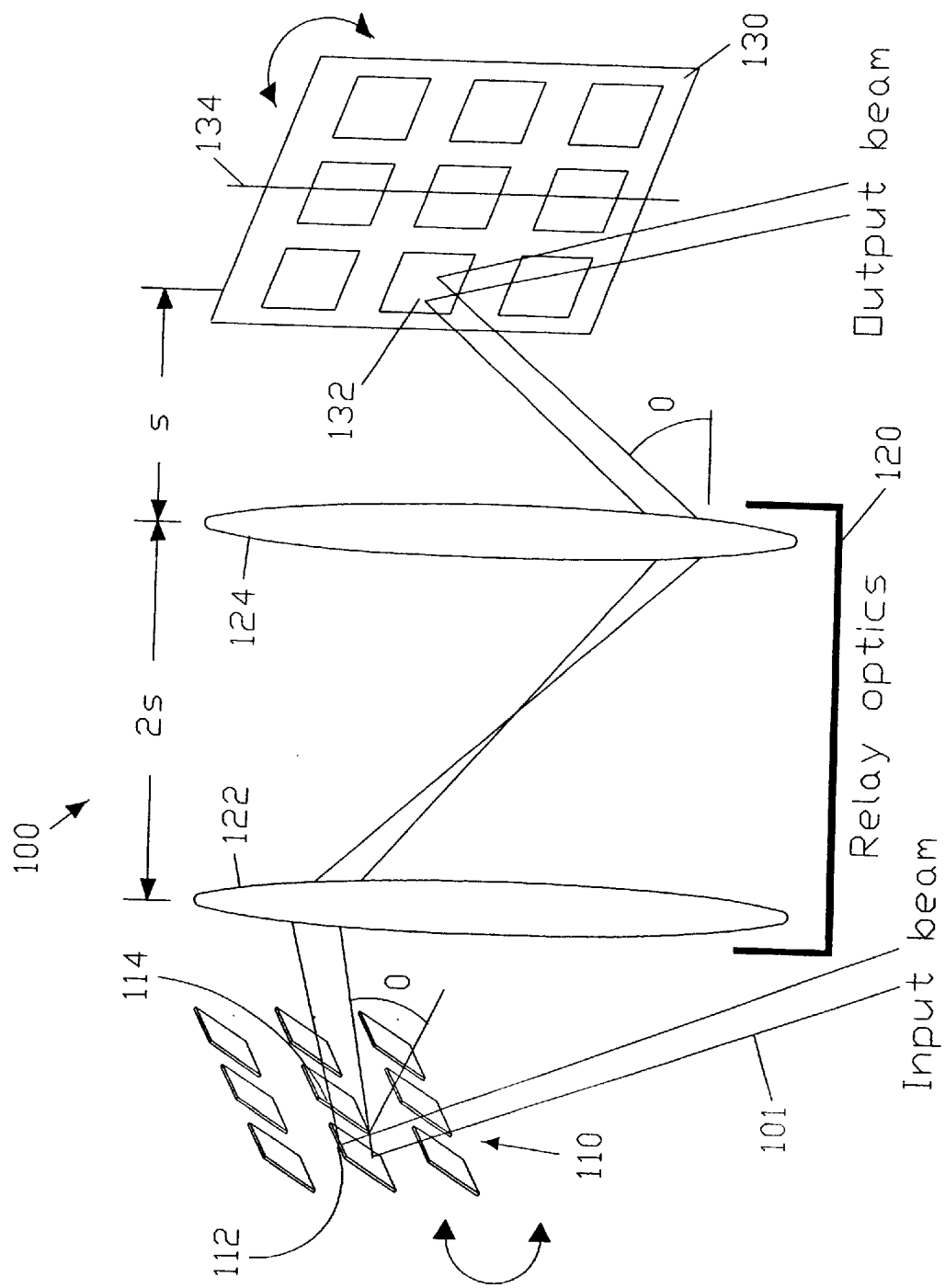
FIG. 3 depicts an isometric view of a beam steering apparatus according to a first embodiment of the present invention.
Figure 4:
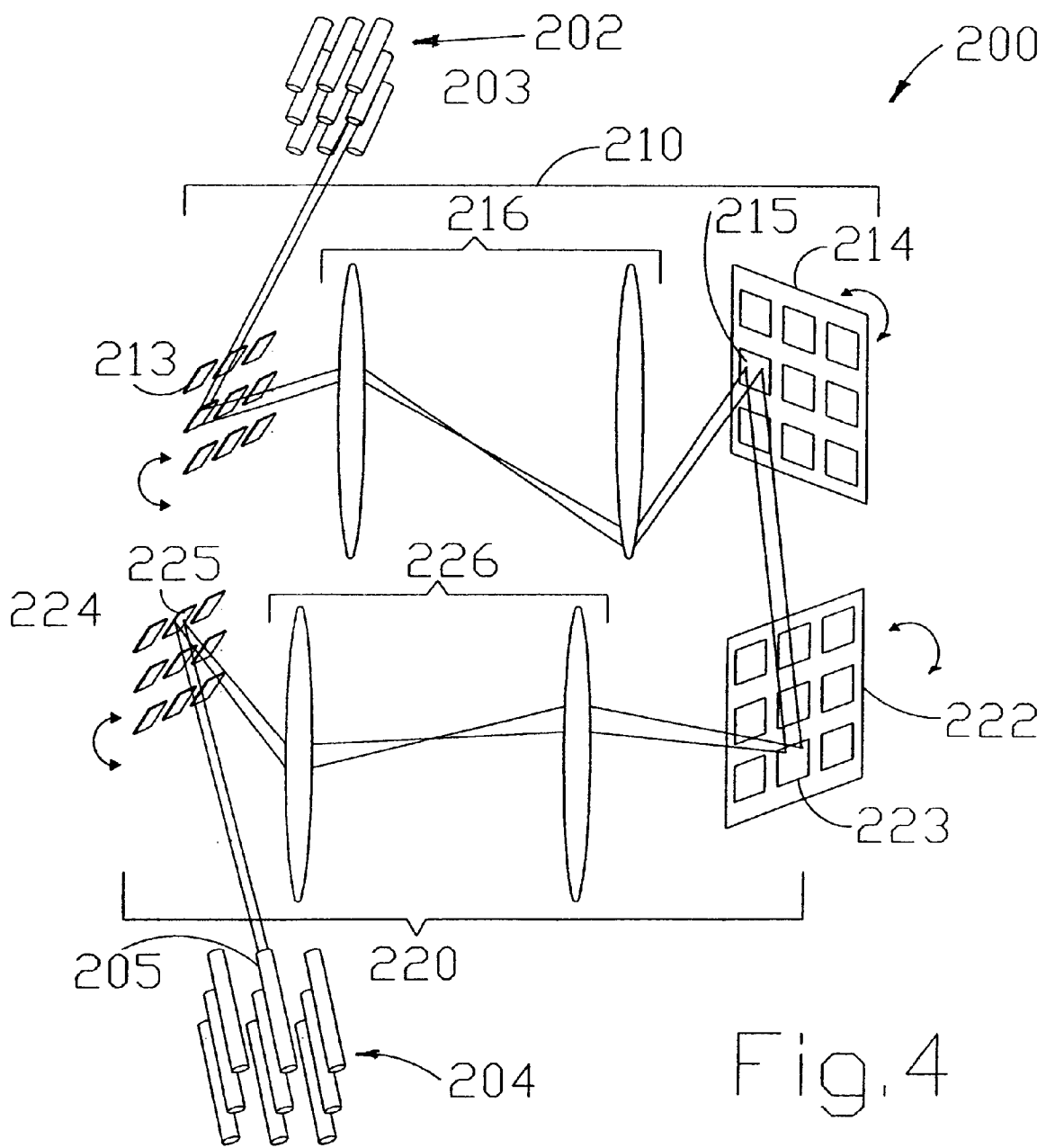
FIGS. 4 depicts an isometric view of a beam steering apparatus according to a second embodiment of the present invention.

FIG. 3 depicts a steered beam switching system 200 according to a second embodiment of the invention. If port count becomes sufficiently on module 100, large losses may occur due to light entering the fibers at two great an angle. To overcome this, the system 200 that utilizes two modules of the type shown in FIG. 2 to ensure that beam 101 enters the output fiber at the correct angle.

The system 200 generally comprises a first module 210 coupled to an N×M input fiber array 202 and a second module 220 coupled to an output fiber array 204. Modules 210 and 220 determine, at the plane of output fiber array 204, the position and angle of an optical beam emerging from any of the input fibers in input fiber array 202. Modules 210 and 220 have features in common with module 100 of FIG. 2. Module 210 comprises single axis mirror arrays 212, 214 and relay optics 216. Mirrors in arrays 212 and 214 rotate about mutually orthogonal axes. Module 220 comprises single axis mirror arrays 222, 224 and relay optics 226. Mirrors in arrays 222 and 224 rotate about mutually orthogonal axes.

In the exemplary embodiment depicted in FIG. 3 mirrors in arrays 214 and 222 rotate about substantially parallel axes. A light beam 201 from a fiber 203 in input fiber array 202 couples to a corresponding mirror 213 in mirror array 212. Mirror 215 steers light beam 201 to a mirror 215 in array 214. Relay optics 216 preserve the angle that light beam 201 makes at with respect to an image plane of relay optics 216. Mirror 215 deflects light beam 201 to a mirror 223 on array 222. Mirror 223 steers light beam 201 to a mirror 225 in array 224. Relay optics 226 preserve at an image plane the angle that light beam 201 makes with respect to an object plane of relay optics 226. Mirror 225 deflects light beam 201 to a corresponding fiber 205 in output fiber array 204.

Those skilled in the art will recognize that by suitable manipulation of mirrors 213, 215, 223, and 225 any fiber in input array 202 may be coupled to any fiber in output array 204.

It will be clear to one skilled in the art that the above embodiment may be altered in many ways without departing from the scope of the invention. For example, although in the above embodiments, the mirrors are described as MEMS mirrors other mirrors such as bulk mirrors or large-area deformable mirrors may be used. Accordingly, the scope of the invention should be determined by the following claims and their legal equivalents.

What is claimed is:

1. A beam steering apparatus comprising:
   a) a first N×M array of mirrors, wherein N and M are integers and each mirror in the first array is configured to rotate about a first axis;
   b) a second N×M array of mirrors, wherein each mirror in the second array is configured to rotate about a second axis;
   c) relay optics disposed along an optical path between the first and second arrays configured to image a light beam emerging from a mirror in the first array onto a corresponding mirror in the second array, wherein the relay optics preserve at an image plane an angle of emergence with respect to an object plane.

2. The apparatus of claim 1, wherein the first axis is substantially perpendicular to the second axis.

3. The apparatus of claim 1 wherein the mirrors in the first array are configured to deflect light from one or more optical fibers in an N×N array of input fibers.

4. The apparatus of claim 1 wherein the mirrors in the first and second arrays are microelectromechanical MEMS) mirrors.

5. The apparatus of claim 1 wherein an angle of a mirror in the first array and an angle of a mirror in the second array determines a position and angle of the light beam at the image plane.

6. The apparatus of claim 1 wherein the relay optics comprises:
  i) a first focusing element having a first focal length;
  ii) a second focusing element having a second focal length.

7. The apparatus of claim 6 wherein the first and second focal lengths are substantially the same.

8. The apparatus of claim 7 wherein the first and second focusing elements are separated from each other by a distance of twice their common focal length.

9. The apparatus of claim 7 wherein the first focusing element is separated from the first mirror array by a distance substantially equal to the first focal length.

10. The apparatus of claim 7 wherein the second focusing element is separated from the second mirror array by a distance substantially equal to the second focal length.

11. A beam steering apparatus comprising:
  a) a first beam steering module; and
  b) a second beam steering module optically coupled to the first beam steering module;
  wherein each of the first and second beam steering modules includes:
    i) a first N×M array of mirrors, wherein N and M are integers and each mirror in the first array is configured to rotate about a single first axis;
    ii) a second N×M array of mirrors, wherein each mirror in the second array is configured to rotate about a single second axis;
    iii) relay optics disposed along an optical path between the first and second arrays configured to image a light beam emerging from a mirror in the first array onto a corresponding mirror in the second array, wherein the relay optics preserve at an image plane an angle of emergence with respect to an object plane.

12. The apparatus of claim 11, wherein the first and second modules are configured to control, at a plane of an output fiber grid, a position and angle of a light beam emerging from any input fiber in an N×M array.

13. The apparatus of claim 11 wherein an angle of a mirror in the first array and an angle of a mirror in the second array determines a position and an angle of the light beam at the image plane.

14. The apparatus of claim 11 wherein the first and second beam steering modules are configured to direct a beam from an input fiber in an N×M input fiber array to an output fiber in an N×M output fiber array.

15. The apparatus of claim 11 wherein at least one of the input and output fiber arrays is an array of collimated fibers.

16. The apparatus of claim 11 wherein the mirrors in the first and second modules are microelectromechanical (MEMS) mirrors.

17. A beam steering method, comprising:
  a) coupling a beam of light to a first mirror in a first N×M array of mirrors, wherein N and M are integers and each mirror in the first array is configured to rotate about a first axis;
  b) deflecting the beam from the first mirror to a second mirror in a second N×M array of mirrors, wherein each mirror in the second array is configured to rotate about a second axis;
  c) imaging the light beam emerging from the first mirror at the second mirror, while preserving at an image plane an angle of emergence with respect to an object plane.

18. The method of claim 17 further comprising:
  d) deflecting the beam from the second mirror to a third mirror in a third N×M array of mirrors, wherein each mirror in the third array is configured to rotate about a third axis substantially parallel to the second axis;
  e) deflecting the beam from the third mirror to a fourth mirror in a fourth N×M array of mirrors, wherein each mirror in the fourth array is configured to rotate about a fourth axis substantially perpendicular to the third axis; and
  f) imaging the light beam emerging from the third mirror at the fourth mirror, wherein an angle of the beam with respect to an image plane is related to an angle of the beam with repsect to an object plane by a predetermined relationship.

19. The method of claim 17 further comprising deflecting the light beam from the fourth mirror to a selected output fiber in an N×M array of output fibers.

20. The method of claim 19 wherein angular positions of the first and second mirrors determines which fiber in the output fiber array is the selected.

21. The method of claim 17 wherein the object plane is located proximate the first array.

22. The method of claim 17 wherein the image plane is located proximate the second array.

23. The method of claim 17 wherein the beam of light originates at an input fiber in an N×M input fiber array.

* * * * *